United States Patent
Herr et al.

(10) Patent No.: US 9,208,861 B2
(45) Date of Patent: Dec. 8, 2015

(54) PHASE HYSTERETIC MAGNETIC JOSEPHSON JUNCTION MEMORY CELL

(71) Applicants: Anna Y. Herr, Ellicott City, MD (US); Quentin P. Herr, Ellicott City, MD (US); Ofer Naaman, Ellicott City, MD (US)

(72) Inventors: Anna Y. Herr, Ellicott City, MD (US); Quentin P. Herr, Ellicott City, MD (US); Ofer Naaman, Ellicott City, MD (US)

(73) Assignee: Northrop Grumman Systems Corporation, Falls Church, VA (US)

(*) Notice: Subject to any disclaimer, the term of this patent is extended or adjusted under 35 U.S.C. 154(b) by 102 days.

(21) Appl. No.: 14/043,360

(22) Filed: Oct. 1, 2013

(65) Prior Publication Data
US 2015/0094207 A1    Apr. 2, 2015

(51) Int. Cl.
| | |
|---|---|
| *G11C 11/44* | (2006.01) |
| *G11C 11/15* | (2006.01) |
| *B82Y 10/00* | (2011.01) |
| *G01R 33/035* | (2006.01) |
| *H01L 27/18* | (2006.01) |
| *H01L 39/02* | (2006.01) |
| *H01L 39/22* | (2006.01) |

(52) U.S. Cl.
CPC ............... *G11C 11/44* (2013.01); *B82Y 10/00* (2013.01); *G01R 33/0354* (2013.01); *G01R 33/0358* (2013.01); *G11C 11/15* (2013.01); *H01L 27/18* (2013.01); *H01L 39/025* (2013.01); *H01L 39/223* (2013.01)

(58) Field of Classification Search
CPC ........ G11C 11/44; G11C 15/06; G11C 11/16; H01L 39/223
USPC .......................................... 365/162, 171, 160
See application file for complete search history.

(56) References Cited

U.S. PATENT DOCUMENTS

| | | |
|---|---|---|
| 8,270,209 B2 | 9/2012 | Herr et al. |
| 2009/0075825 A1 | 3/2009 | Rose et al. |
| 2009/0244958 A1 | 10/2009 | Bulzacchelli et al. |
| 2011/0267878 A1* | 11/2011 | Herr et al. ............... 365/171 |
| 2012/0108434 A1 | 5/2012 | Bulzacchelli et al. |
| 2012/0184445 A1 | 7/2012 | Mukhanov et al. |

* cited by examiner

*Primary Examiner* — Huan Hoang
(74) *Attorney, Agent, or Firm* — Tarolli, Sundheim, Covell & Tummino LLP

(57) ABSTRACT

One embodiment describes a memory cell. The memory cell includes a phase hysteretic magnetic Josephson junction (PHMJJ) that is configured to store one of a first binary logic state corresponding to a binary logic-1 state and a second binary logic state corresponding to a binary logic-0 state in response to a write current and to generate a superconducting phase based on the stored digital state. The memory cell also includes at least one Josephson junction having a critical current that is based on the superconducting phase of the PHMJJ and being configured to provide an output corresponding to the stored digital state in response to a read current.

20 Claims, 4 Drawing Sheets

250 ↘

┌─ 252
GENERATE A WORD-READ CURRENT ON A WORD-READ LINE TO SELECT A RESPECTIVE ONE OF A PLURALITY OF ROWS OF AN ARRAY OF MEMORY CELLS, EACH OF THE MEMORY CELLS COMPRISING A PHASE HYSTERETIC MAGNETIC JOSEPHSON JUNCTION (PHMJJ) THAT IS CONFIGURED TO STORE A DIGITAL STATE CORRESPONDING TO ONE OF A BINARY LOGIC-1 STATE AND A BINARY LOGIC-0 STATE

┌─ 254
GENERATE A BIT-READ CURRENT ON A BIT-LINE ASSOCIATED WITH EACH OF A PLURALITY OF COLUMNS OF THE ARRAY OF MEMORY CELLS

┌─ 256
READ THE DIGITAL STATE FROM EACH OF THE MEMORY CELLS IN THE RESPECTIVE ONE OF THE PLURALITY OF ROWS BASED ON WHETHER AT LEAST ONE JOSEPHSON JUNCTION IN THE RESPECTIVE MEMORY CELLS TRIGGERS IN RESPONSE TO THE WORD-READ CURRENT AND THE BIT-READ CURRENT ASSOCIATED WITH EACH OF THE PLURALITY OF COLUMNS OF THE ARRAY OF MEMORY CELLS BASED ON A SUPERCONDUCTING PHASE PROVIDED BY THE PHMJJ CORRESPONDING TO THE STORED DIGITAL STATE

FIG. 6

PHASE HYSTERETIC MAGNETIC JOSEPHSON JUNCTION MEMORY CELL

TECHNICAL FIELD

The present invention relates generally to quantum and classical digital superconducting circuits, and specifically to a phase hysteretic magnetic Josephson junction memory cell.

BACKGROUND

Superconducting digital technology has provided computing and/or communications resources that benefit from unprecedented high speed, low power dissipation, and low operating temperature. For decades, superconducting digital technology has lacked random-access memory (RAM) with adequate capacity and speed relative to logic circuits. This has been a major obstacle to industrialization for current applications of superconducting technology in telecommunications and signal intelligence, and can be especially forbidding for high-end and quantum computing. All concepts currently considered for superconducting memory have been based on quantization of magnetic flux quanta in a superconducting inductive loop. Such memories can be readily adapted to high speed register files given a foundry process with adequate yield, but can never achieve the integration density of complementary metal-oxide semiconductor (CMOS), as they are fundamentally limited by the size of the inductive loop. One hybrid memory solution has been proposed where the memory core implements CMOS technology and the bit-line detection is done with Josephson devices. However, such a configuration yields only nominally higher performance than standard CMOS and suffers from relatively high power dissipation for a cryogenic environment.

SUMMARY

One embodiment describes a memory cell. The memory cell includes a phase hysteretic magnetic Josephson junction (PHMJJ) that is configured to store one of a first binary logic state corresponding to a binary logic-1 state and a second binary logic state corresponding to a binary logic-0 state in response to a first write current and a second write current and to generate a superconducting phase based on the stored digital state. The memory cell also includes at least one Josephson junction having a critical current that is based on the superconducting phase of the PHMJJ and being configured to provide an output corresponding to the stored digital state in response to a first read current and a second read current.

Another aspect of the present invention includes a method for reading a JMRAM. The method includes generating a word-read current on a word-read line to select a respective one of a plurality of rows of an array of memory cells, each of the memory cells comprising a phase hysteretic magnetic Josephson junction (PHMJJ) that is configured to store a digital state corresponding to one of a binary logic-1 state and a binary logic-0 state. The method also includes generating a bit-read current on a bit-read line associated with each of a plurality of columns of the array of memory cells. The method further includes reading the digital state from each of the memory cells in the respective one of the plurality of rows based on whether at least one Josephson junction in the respective memory cells triggers in response to the word-read current and the bit-read current associated with each of the plurality of columns of the array of memory cells based on a superconducting phase provided by the PHMJJ corresponding to the stored digital state.

Another aspect of the present invention includes a memory array. The memory array includes a plurality of word-write lines each configured to conduct a respective word-write current that selects a given row of memory cells during a data write operation. Each of the memory cells includes a PHMJJ. The memory array also includes a plurality of bit-write lines each configured to conduct a respective bit-write current to write a digital state corresponding to one of a binary logic-0 state and a binary logic-1 state into the PHMJJ associated with each memory cell of the given row of memory cells. The PHMJJ can be magnetically coupled to a respective one of the plurality of word-write lines and a respective one of the plurality of bit-write lines. The memory array also includes a plurality of word-read lines each configured to conduct a respective word-read current that selects a given row of memory cells during a data read operation. The memory array further includes a plurality of bit-read lines each configured to conduct a respective bit-read current through each of the memory cells in a given column, the at least one Josephson junction providing an indication of the stored digital state during the data read operation in response to the word-read current, the bit-read current, and a superconducting phase provided by the PHMJJ corresponding to the stored digital state.

BRIEF DESCRIPTION OF THE DRAWINGS

FIG. 6 illustrates an example of a method for reading a memory cell in a JMRAM system.

DETAILED DESCRIPTION

The present invention relates generally to quantum and classical digital superconducting circuits, and specifically to a phase hysteretic magnetic Josephson junction memory cell. The JMRAM system can implement an array of memory cells that each includes a phase hysteretic magnetic Josephson junction (PHMJJ) that can be configured as including ferromagnetic materials in an associated barrier. The memory cells can also each include at least one Josephson junction (e.g., a pair of Josephson junctions in parallel with the PHMJJ). The PHMJJ can be configured to store a digital state corresponding to one of a binary logic-1 state or a binary logic-0 state in response to a word-write current and a bit-write current associated with the PHMJJ. As an example, the word-write and bit-write currents can each be provided on dedicated word-write and bit-write lines, and can set the logic state of the PHMJJ based on respective current flow directions relative to each other.

In addition, the PHMJJ of each of the memory cells of the array can provide an indication of the stored digital state in response to a word-read current and a bit-read current. As an example, the PHMJJ can be configured as a switchable π-junction that is configured to generate a superconducting phase based on the digital state stored therein. The superconducting phase can thus lower a critical current associated with the at least one Josephson junction of each of the memory cells of a row of the array. Therefore, the word-read current and the bit-read current can be provided to trigger the Josephson junction(s) to change a voltage on the associated bit-read line based on the PHMJJ storing a digital state corresponding to a binary logic-1 state, and to not trigger based on the PHMJJ storing a digital state corresponding to a binary logic-0 state. Thus, the bit-read line can have a voltage having a magnitude that varies based on whether the digital state of the PHMJJ corresponds to the binary logic-1 state or the binary logic-0 state (e.g., between a zero and a non-zero amplitude). As described herein, the term "trigger" with respect to Josephson junctions describes the phenomenon of the Josephson junction generating a discrete voltage pulse in response to a current flow through the Josephson junction exceeding a critical current.

Figure 1:
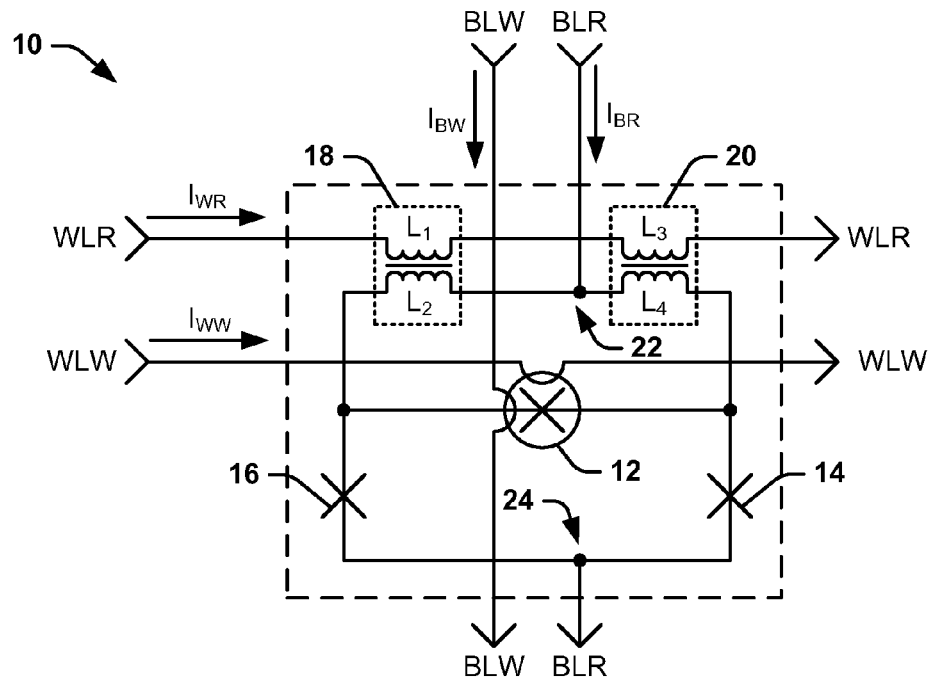
FIG. 1 illustrates an example of a memory cell.

FIG. 1 illustrates an example of a memory cell 10 in accordance with an aspect of the invention. As an example, the memory cell 10 can correspond to one of a plurality of memory cells that are arranged in an array as rows and columns, as described in greater detail herein.

The memory cell 10 includes a first write line WLW and a first read line WLR that each pass through the memory cell 10. The first write line WLW conducts a first write current $I_{WW}$ during a data write operation and the first read line WLR conducts a first read current $I_{WR}$ during a data read operation. As an example, the first write current $I_{WW}$ can correspond to a word-write current associated with a row of memory cells in an array, and the first read current $I_{WR}$ can correspond to a word-read current associated with the row of memory cells in the array. For example, the first write and first read lines WLW and WLR can likewise be coupled to adjacent memory cells in a given row on either side of the memory cell 10. Thus, the first read and first write currents $I_{WW}$ and $I_{WR}$ flow through all of the memory cell systems in the row, including the memory cell 10, during the respective data write and data read operations. Similarly, the memory cell 10 includes a second write line BLW and a second read line BLR that each pass through the memory cell 10. The second write line BLW conducts a second write current $I_{BW}$ during the data write operation and the second read line BLR conducts a second read current $I_{BR}$ during the data read operation. As an example, the second write current $I_{BW}$ can correspond to a bit-write current associated with a column of memory cells in the array, and the first read current $I_{BR}$ can correspond to a bit-read current associated with the column of memory cells in the array. In a similar manner, the second write and second read lines BLW and BLR can likewise be coupled to adjacent memory cells in a given column above and below the memory cell 10. Thus, the second read and second write currents $I_{BW}$ and $I_{BR}$ flow through all of the memory cell systems in the column, including the memory cell 10, during the respective data write and data read operations.

The memory cell 10 also includes a phase hysteretic magnetic Josephson junction (PHMJJ) 12 that is configured to store a digital state corresponding to one of the binary logic-1 state or the binary logic-0 state. As an example, the PHMJJ 12 can include ferromagnetic materials in associated barriers to be configured as a switchable π-junction. The memory cell 10 also includes a first Josephson junction 14 and a second Josephson junction 16 that are arranged in parallel with the PHMJJ 12. As an example, the Josephson junctions 14 and 16 can be configured as superconductor-ferromagnetic-superconductor (SFS) Josephson junctions. The PHMJJ 12 can include outer layers of superconducting material, such as Niobium (Nb), and one or more internal thin film layers of ferromagnetic materials. As an example, the thin film layers of ferromagnetic materials can include one or more "hard" ferromagnetic layers having a substantially fixed magnetic field and one or more "soft" ferromagnetic layers that can be changed as a result of magnetic fields generated locally by orthogonal electrical currents. Furthermore, the PHMJJ 12 can include one or more additional layers, such as oxide layers, that are interleaved with the superconducting and/or ferromagnetic layers.

In the example of FIG. 1, the first write line WLW and the second write line BLW are demonstrated as magnetically coupled to the PHMJJ 12, as indicated at 16. As an example, the PHMJJ 12 can include two or more different ferromagnetic layers, and the orientation of the magnetic field in one of the ferromagnetic layers is substantially fixed. The magnetic field orientation of the other one or more ferromagnetic layers can be changed as a result of magnetic fields that are generated locally by the first write current $I_{WW}$ and the second write current $I_{BW}$.

Therefore, based on the configuration of the PHMJJ 12, the first write current $I_{WW}$ and the second write current $I_{BW}$ can generate the magnetic field to set the digital state of the PHMJJ 12 to a binary logic-1 state or a binary logic-0 state using magneto-current states of the PHMJJ 12 based on the respective directions of current flow during a data write operation. As one example, if the combined magnetic field produced by the first write current $I_{WW}$ and the second write current $I_{BW}$ has the same orientation as the internal magnetic field of the hard ferromagnetic layers, the individual magnetic fields of each of the first write current $I_{WW}$ and the second write current $I_{BW}$ can add together positively or negatively to set the digital state of the phase hysteretic magnetic Josephson junction to correspond to a binary logic-1 state or a binary logic-0 state respectively. However, if the combined magnetic field produced by the first write current $I_{WW}$ and the second write current $I_{BW}$ has the opposite orientation as the internal magnetic field of the hard ferromagnetic layers, the digital state of the PHMJJ 12 remains unchanged. As another example, the first write current $I_{WW}$ and the second write current $I_{BW}$ can be applied as a sequence of write current pulses, such that if the first write current pulse $I_{WW}$ overlaps in time with the second write current pulse $I_{BW}$, the digital state of the PHMJJ 12 can correspond to a binary logic-1 state or a binary logic-0 state. However, if only one such pulse is present at a given time, or if the first and the second write current pulses $I_{WW}$ and $I_{BW}$ do not sufficiently overlap in time, the digital state of the PHMJJ 12 can remain unchanged.

Similarly, the individual magnetic field of only one of the first write current $I_{WW}$ and the second write current $I_{BW}$ may be insufficient to change the digital state of the PHMJJ 12, such that memory cells in unaddressed rows maintain their respective digital states despite the flow of the second write current $I_{BW}$. Furthermore, based on the superconductivity of the first write line WLW and the second write line BLW and the presence of a superconducting ground plane, cross coupling between the first write line WLW and the second write line BLW can be substantially mitigated. Therefore, for a given current-flow direction of the first write current $I_{WW}$ in a given row, the current-flow directions of the respective second write currents $I_{BW}$ in each of the columns can be controlled to set the digital state of each of the PHMJJs 12 in a given row during a data write operation without affecting the digital states in any of the memory cells in any of the other rows through which a first write current $I_{WW}$ is not provided.

In the example of FIG. 1, the memory cell 10 includes a first transformer 18 and a second transformer 20 that are arranged in series with respect to each other. Specifically, the first transformer 18 includes a primary winding $L_1$ and the second transformer 20 includes a primary winding $L_3$ that are arranged in series on the first read line WLR through which the first read current $I_{WR}$ flows. The first transformer 18 also includes a secondary winding $L_2$ inductively coupled to the primary winding $L_1$ and the second transformer 20 also includes a secondary winding $L_4$ inductively coupled to the primary winding $L_3$. The secondary windings $L_2$ and $L_4$ are collectively arranged in parallel with the PHMJJ 12 and in parallel with the Josephson junctions 14 and 16. Therefore, the first read current $I_{WR}$ is inductively provided to the Josephson junctions 14 and 16, as described in greater detail herein. As described herein, the first read current $I_{WR}$ being provided to the Josephson junctions 14 and 16 can refer to the first read current $I_{WR}$ being provided to the Josephson junctions 14 and 16 directly or inductively, as described in the example of FIG. 1. The second read line BLR is coupled to a node 22 between the secondary windings $L_2$ and $L_4$, such that the second read current $I_{BR}$ enters the memory cell 10 at the node 22, and is coupled to a node 24 corresponding to an output of the memory cell 10 between the Josephson junctions 14 and 16, such that the second read current $I_{BR}$ exits the memory cell 10 from the node 24.

The digital state of the PHMJJ 12 can be read from the memory cell 10 in response to the first read current $I_{WR}$ and the second read current $I_{BR}$. Specifically, the first read current $I_{WR}$ can be provided on the first read line WLR to select the row of memory cells in the associated memory array. As an example, the first read current $I_{WR}$ flows through the primary windings $L_1$ and $L_3$ of the respective transformers 18 and 20 as a DC current pulse. The DC current pulse of the first read current $I_{WR}$ is inductively provided to the PHMJJ 12 and the Josephson junctions 14 and 16. The second read current $I_{BR}$ is provided between the secondary windings $L_2$ and $L_4$. Therefore, the current induced by the first read current $I_{WR}$ via the secondary windings $L_2$ and $L_4$ is added to second read current $I_{BR}$ based on the direction of current flow of the first read current $I_{WR}$. The stored binary digital state of the PHMJJ 12 can be determinative of the critical current necessary to trigger the Josephson junctions 14 and 16 based on the superconducting phase that can be provided by the PHMJJ 12.

For example, if the PHMJJ 12 is in a zero state, and thus stores a logic-0 binary state, the PHMJJ 12 is in a substantially minimum Josephson energy ground state that does not provide superconducting phase. Therefore, the added magnitude of the second read current $I_{BR}$ and the first read current $I_{WR}$, as induced to the Josephson junctions 14 and 16, is not sufficient to trigger the Josephson junctions 14 and 16. Accordingly, a voltage on the second read line BLR can remain at a substantially decreased magnitude (e.g., zero volts) to indicate the logic-0 state. However, as another example, if the PHMJJ 12 is in a π-state, and thus stores a logic-1 binary state, the PHMJJ 12 has a substantially maximum Josephson energy and provides a superconducting phase that is added to the magnitude of the second read current $I_{BR}$ and the first read current $I_{WR}$. As described herein, the term "superconducting phase" corresponds to a spontaneous supercurrent circulating in a loop through the PHMJJ 12 and the Josephson junctions 14 and 16 in response to the PHMJJ 12 being in the it-state, with the supercurrent having a magnitude based on an internal superconductor flux quantum divided by a mutual inductance term. Therefore, the contribution of the superconducting phase, the second read current $I_{BR}$, and the first read current $I_{WR}$, as induced to the Josephson junctions 14 and 16, is sufficient to trigger the Josephson junctions 14 and 16. Accordingly, the Josephson junctions 14 and 16 can trigger in an oscillatory manner to increase the voltage on the second read line BLR to indicate the logic-1 state.

Figure 2:
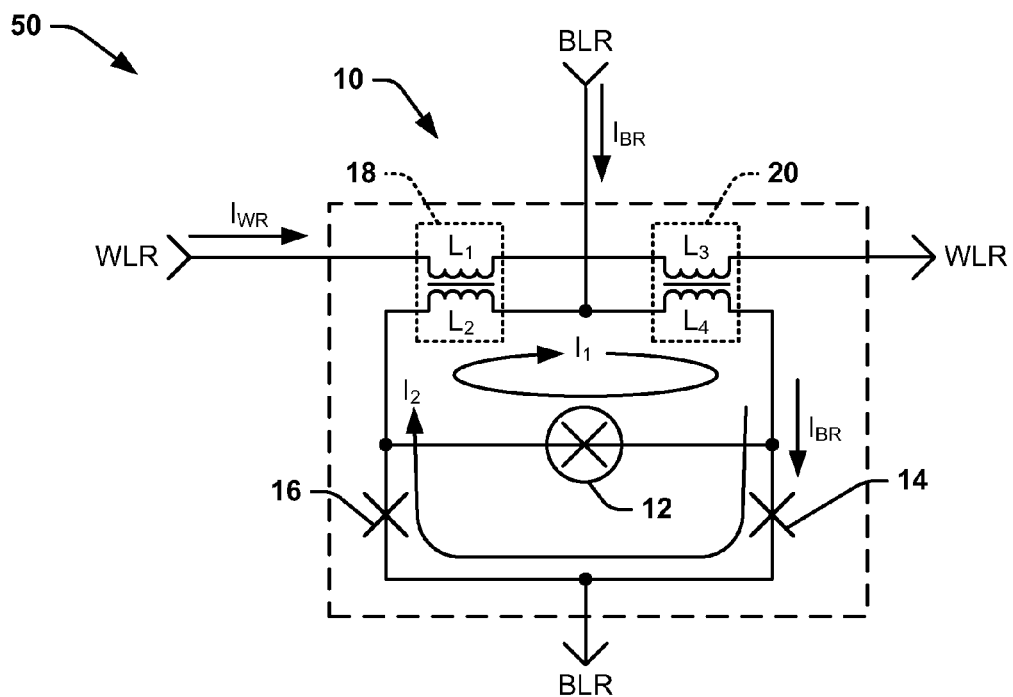
FIG. 2. illustrates an example of a diagram of readout of a memory cell

FIG. 2 illustrates an example of a diagram 50 of readout of the memory cell 10. The memory cell 10 is demonstrated in the example of FIG. 2 as excluding the second write line BLW and the first write line WLW for simplicity. In the example of FIG. 2, the PHMJJ 12 is in a zero state, and thus stores a logic-0 binary state. As a result, in the example of FIG. 2, the PHMJJ 12 provides a magnitude zero superconducting phase (i.e., no superconducting phase).

The first read current $I_{WR}$ flows through the primary windings $L_1$ and $L_3$ of the respective transformers 18 and 20 (e.g., as a DC current pulse), and is thus inductively provided to the PHMJJ 12 and the Josephson junctions 14 and 16. Additionally, the second read current $I_{BR}$ is provided to the memory cell 10 between the secondary windings $L_2$ and $L_4$. Therefore, the current induced by the first read current $I_{WR}$ via the secondary windings $L_2$ and $L_4$ is added to second read current $I_{BR}$ based on the direction of current flow of the first read current $I_{WR}$. In the example of FIG. 2, the induced first read current $I_{WR}$ and the second read current $I_{BR}$ are combined to provide a first current loop $I_1$ that flows through the PHMJJ 12 and the secondary windings $L_2$ and $L_4$ and a second current loop $I_2$ that flows through the Josephson junctions 14 and 16 and the secondary windings $L_2$ and $L_4$. Because the PHMJJ 12 does not provide any superconducting phase, a portion of both the induced first read current $I_{WR}$ and the second read current $I_{BR}$ flows through the PHMJJ 12 (i.e., the current loop $I_1$ in the example of FIG. 2). Therefore, this portion of both the induced first read current $I_{WR}$ and the second read current $I_{BR}$ that flows through the PHMJJ 12 is diverted away from flowing through the Josephson junctions 14 and 16, leaving only the portion of the current loop $I_2$ as a sense current flowing through the Josephson junctions 14 and 16. The current loop $I_2$ can thus have a magnitude that is less than the critical current of the Josephson junctions 14 and 16, and is thus insufficient to trigger the Josephson junctions 14 and 16. Accordingly, a voltage that is measured on the second read line BLR maintains a substantially lesser magnitude (e.g., zero volts) to indicate the logic-0 binary state that is stored in the PHMJJ 12.

Figure 3:
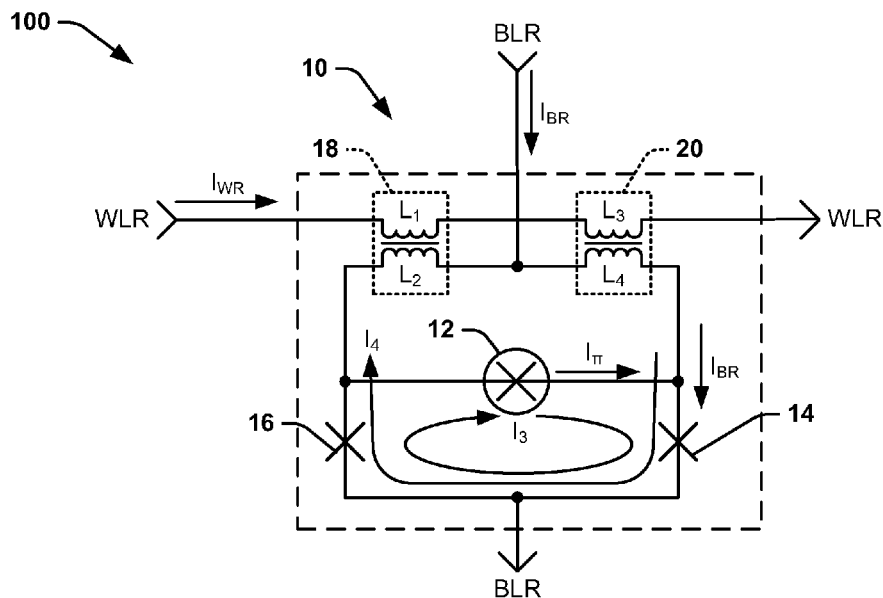
FIG. 3 illustrates another example of a diagram of readout of a memory cell.

FIG. 3 illustrates another example of a diagram 100 of readout of the memory cell 10. Similar to as described previously in the example of FIG. 2, the memory cell 10 is demonstrated in the example of FIG. 3 as excluding the second write line BLW and the first write line WLW for simplicity. In the example of FIG. 3, the PHMJJ 12 is in a π-state, and thus stores a logic-1 binary state. As a result, in the example of FIG. 3, the PHMJJ 12 provides a superconducting phase that is demonstrated diagrammatically as a current L.

Similar to as described previously, the induced first read current $I_{WR}$ is added to second read current $I_{BR}$ based on the direction of current flow of the first read current $I_{WR}$. However, because the PHMJJ 12 is in the it-state, and thus produces the superconducting phase demonstrated by the current $I_\pi$, the combined induced first read current $I_{WR}$ and second read current $I_{BR}$ are suppressed from flowing through the PHMJJ 12 from the secondary winding $L_4$. Therefore, substantially all of the combined induced first read current $I_{WR}$ and second read current $I_{BR}$ flows through the Josephson junction 14. In the example of FIG. 3, the induced first read current $I_{WR}$, the second read current $I_{BR}$, and the superconducting phase current $I_\pi$ are combined to provide a first current loop $I_3$ that flows through the PHMJJ 12 and the Josephson junctions 14 and 16 and a second current loop $I_4$ that flows through the Josephson junctions 14 and 16 and the secondary windings $L_2$ and $L_4$. As an example, the first current loop $I_3$ can correspond to the current $I_\pi$ flowing as a supercurrent loop through the PHMJJ 12 and the Josephson junctions 14 and 16, and the second current loop $I_4$ can correspond to a sum of the first read current $I_{WR}$ and second read current $I_{BR}$. Because the first and second current loops $I_3$ and $I_4$ are combined to flow through the Josephson junctions 14 and 16, the combined first and second current loops $I_3$ and $I_4$ can have a magnitude that is greater than the critical current of the Josephson junction 14, and is thus sufficient to trigger the Josephson junction 14. In response, the Josephson junction 14 can trigger to generate a voltage pulse on the second read line BLR. The triggering of the Josephson junction 14 can thus cause the Josephson junction 16 to trigger, which can thus continue to provide sequential triggering between the Josephson junctions 14 and 16 in an oscillatory manner to substantially maintain the voltage pulses on the second read line BLR. Accordingly, the substantially increased voltage provided by the voltage pulses on the second read line BLR can indicate the logic-1 binary state that is stored in the PHMJJ 12.

It is to be understood that the memory cell 10 is not intended to be limited to the example of FIGS. 1 through 3. As an example, the memory cell 10 is demonstrated diagrammatically, such that the arrangement of the first lines WLR and WLW and the second lines BLR and BLW with respect to each other and to the PHMJJ 12 can vary. For example, the configuration of the first write line WLW and the second write line BLW can be such that the direction of current flow of the first write current $I_{WW}$ and the second write current $I_{BW}$ can be opposite to store the digital state in the PHMJJ 12. In addition, the memory cell 10 is not limited to implementing a pair of Josephson junctions 14 and 16 in parallel with the PHMJJ 12, but could instead implement additional Josephson junctions or a single Josephson junction or could be configured as a variety of other arrangements. Accordingly, the memory cell 10 can be configured in a variety of ways.

Figure 4:
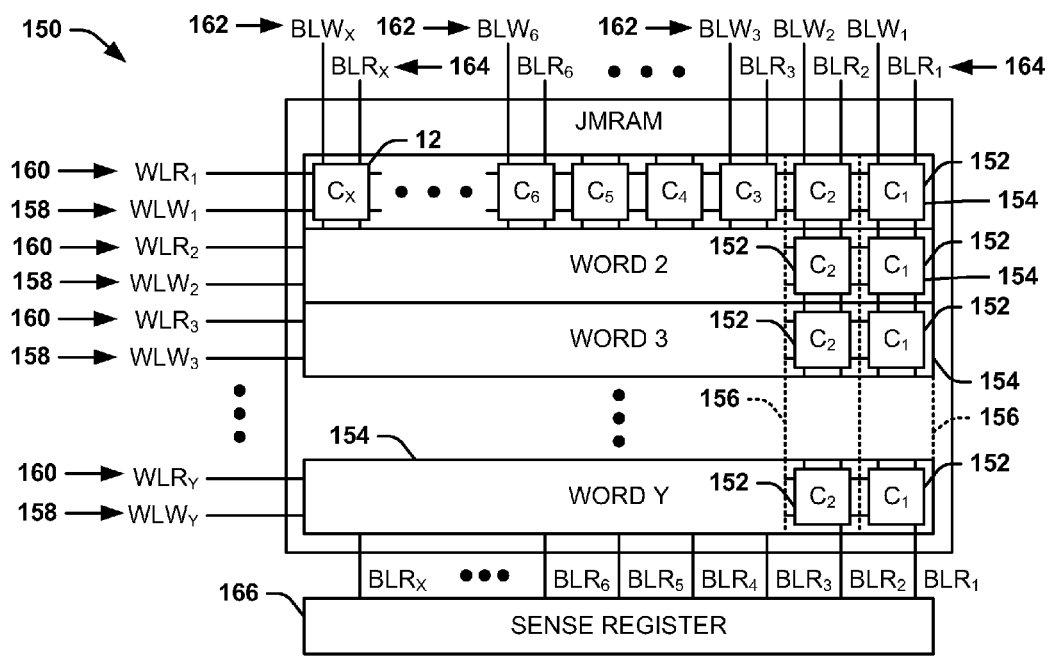
FIG. 4 illustrates an example of a Josephson magnetic random access memory (JMRAM) system.

FIG. 4 illustrates an example of a Josephson magnetic random access memory (JMRAM) system 150 in accordance with an aspect of the invention. The JMRAM system 150 can be implemented as a memory structure in a variety of computing applications.

The JMRAM system 150 is demonstrated in the example of FIG. 4 as being arranged as an array of memory cells 152. Specifically, the memory cells 152 are arranged in rows 154 that each correspond to a data word, demonstrated as WORD 1 through WORD Y, where Y is an integer greater than 1. Each of the rows 154 includes a set of memory cells 152 that form X columns 156 across the rows 154, with the memory cells 152 in WORD 1 being demonstrated in the example of FIG. 4 as $C_1$ to $C_X$, where X is an integer greater than 1. Therefore, each of the memory cells 152 in the array of the JMRAM system 150 can be individually addressable by row 154 and column 156.

In the example of FIG. 4, each of the rows 154 is demonstrated as having an associated word-write line 158 and word-read line 160, demonstrated as $WLW_1$ and $WLR_1$ through $WLW_Y$ and $WLR_Y$, respectively. The word-write line 158 and word-read line 160 can be inductively and/or magnetically coupled to each of the memory cells 152 in each of the rows 154 of the JMRAM system 150. In addition, each of the memory cells 152 is demonstrated as having an associated bit-write line 162 and bit-read line 164, demonstrated as $BLW_1$ and $BLR_1$ through $BLW_X$ and $BLR_X$, respectively. The bit-write line 162 and bit-read line 164 can be coupled to each corresponding numbered memory cell 152 in each of the rows 154 of the JMRAM system 150, such that the memory cells 152 in each column 156 are arranged in series with respect to the bit-write line 162 and bit-read line 164. Although the example of FIG. 4 describes that the word-write lines 158 and word-read lines 160 and the bit-write lines 162 and bit-read lines 164 are arranged in series with other adjacent memory cells in the respective row and column, the word-write lines 158 and word-read lines 160 and the bit-write lines 162 and bit-read lines 164 could instead be dedicated with respect to each memory cell 152.

Each of the memory cells 152 is configured to store a single bit of data. Specifically, each of the memory cells 152 can include at least one phase hysteretic magnetic Josephson junction that can be configured to store a digital state corresponding to a binary logic-1 or a binary logic-0. The digital state can be set in response to a word-write current that is provided on the respective word-write line 158 and a bit-write current that is provided on the respective bit-write line 162. Similarly, the respective digital state that is stored in each of the memory cells 152 can be read from the memory cells 152 based on a word-read current that is provided on the respective word-read line 160 to select a given one of the rows 154 and a bit-read current that is provided on the respective bit-read line 164. Specifically, the bit-read line 164 of each of the columns 156 is coupled to a sense register 166 that is configured to measure the respective bit-read line 164 to determine whether digital state of each of the memory cells 152 of an associated row 154 correspond to a binary logic-1 state or a binary logic-0 state in response to the word-read current and the bit-read current during a data read operation. As an example, the sense register 166 can measure a voltage or a current associated with the bit-read line 164, as described in greater detail herein.

Figure 5:
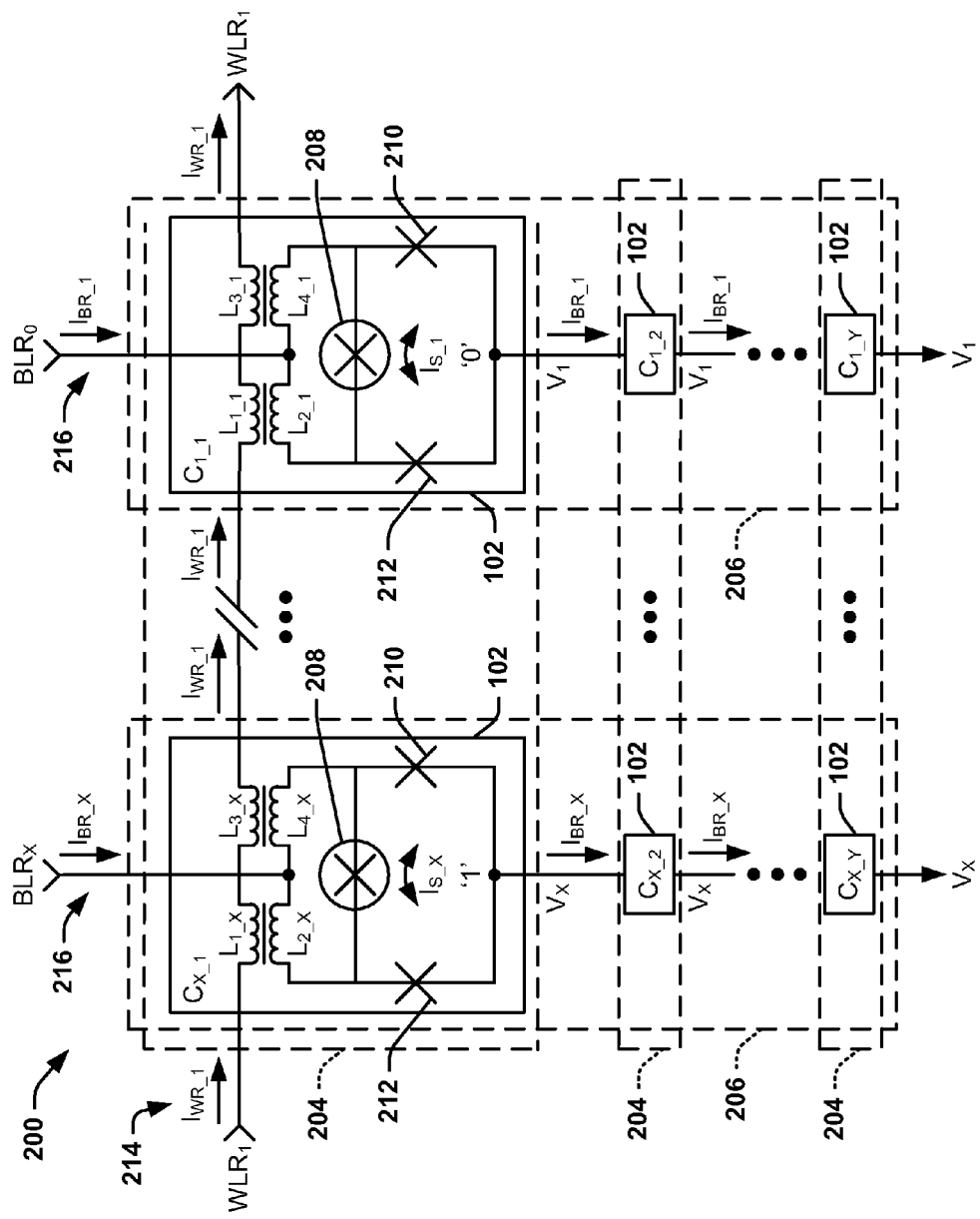
FIG. 5 illustrates another example of a JMRAM system.

FIG. 5 illustrates another example of a JMRAM system 200 in accordance with an aspect of the invention. The JMRAM system 200 can be configured similar to the JMRAM system 200 in the example of FIG. 4. Thus, reference is to be made to the example of FIG. 4 in the following description of the example of FIG. 5. Specifically, the example of FIG. 5 demonstrates a data read operation in which data is read from the JMRAM system 200.

The JMRAM system 200 is demonstrated in the example of FIG. 5 as being arranged as an array of memory cells 202. Specifically, the memory cells 202 are arranged in rows 204 that each correspond to a data WORD 1 through Y, where Y is an integer greater than 1. Each of the rows 204 includes a set of memory cells 202 that form X columns 206 across the rows 204, where X is an integer greater than 1. In the example of FIG. 5, each of the demonstrated memory cells 202 is designated by column and row, from $C_{1\_1}$ to $C_{X\_Y}$.

In the example of FIG. 5, the memory cells 202 corresponding to memory cells $C_{1\_1}$ and $C_{X\_1}$ are demonstrated in greater detail. Specifically, similar to the memory cell 50 in the example of FIG. 4, the memory cells $C_{1\_1}$ and $C_{X\_1}$ include first and second transformers that include primary windings $L_{1\_1}$ and $L_{3\_1}$ and $L_{1\_X}$ and $L_{3\_X}$, respectively, and secondary windings $L_{2\_1}$ and $L_{4\_1}$ and $L_{2\_X}$ and $L_{4\_X}$, respectively. The memory cells $C_{1\_1}$ and $C_{X\_1}$ also each include a PHMJJ 208 in parallel with a pair of Josephson junctions 210 and 212. It is to be understood that the memory cells $C_{1\_1}$ and $C_{X\_1}$ can also include word-write and bit-write lines, similar to as demonstrated in the example of FIG. 4, but have been omitted from the example of FIG. 5 for brevity.

The JMRAM system 200 also includes a word-read line 214, demonstrated as $WLR_1$, thus corresponding to the $1^{st}$ row 204, which passes through the primary windings $L_{1\_X}$ and $L_{3\_X}$ and $L_{1\_1}$ and $L_{3\_1}$ of the memory cells $C_{X\_1}$ and $C_{1\_1}$, respectively. The JMRAM system 200 also includes bit-read lines 216, demonstrated as $BLR_X$ and $BLR_1$, thus corresponding to the $X^{th}$ and $1^{st}$ columns 206, respectively. The bit-read lines 216 are demonstrated as coupled to the PHMJJs 208. It is to be understood that, while the example of FIG. 5 only demonstrates the word-read line $WLR_1$ and the bit-read lines $BLR_X$ and $BLR_1$, the JMRAM system 200 also includes additional word-read lines 214 for each of the rows 204 and additional bit-read lines 216 for each of the columns 206.

The word-read line $WLR_1$ conducts a DC word-read current pulse $I_{WR}$ that passes through the $1^{st}$ row 204, including the memory cells $C_{X\_1}$ and $C_{1\_1}$ which selects the $1^{st}$ row 204 for reading. As a result, the word-read current $I_{WR}$ induces a DC current pulse from the primary windings $L_{1\_1}$ and $L_{3\_1}$ and $L_{1\_X}$ and $L_{3\_X}$, respectively, to the secondary windings $L_{2\_1}$ and $L_{4\_1}$ and $L_{2\_X}$ and $L_{4\_X}$, respectively. In addition, the bit-read lines $BLR_X$ and $BLR_1$ conduct bit-read currents $I_{BR\_X}$ and $I_{BR\_1}$, respectively, that pass through the $X^{th}$ and $1^{st}$ columns 206, including the memory cells $C_{X\_1}$ and $C_{1\_1}$. The collective current of the word-read current $I_{WR}$ and the bit-read currents $I_{BR\_X}$ and $I_{BR\_1}$ through the Josephson junctions 210 and 212 are demonstrated collectively in the memory cells $C_{X\_1}$ and $C_{1\_1}$ as sense currents $I_{S\_X}$ and $I_{S\_1}$, respectively.

In the example of FIG. 5, the PHMJJ 208 that is associated with the memory cell $C_{X\_1}$ is demonstrated as storing a binary logic-1 state ('1') and the PHMJJ 208 that is associated with the memory cell $C_{1\_1}$ is demonstrated as storing a binary logic-0 state ('0'). The digital states of the memory cells $C_{X\_1}$ and $C_{1\_1}$, as well as the remaining memory cells 202 in the $1^{st}$ row 204, could have been set in a previously performed data write operation. Similar to as described above in the example of FIG. 4, the PHMJJs 208 can provide a superconducting phase that affects the critical current of the Josephson junctions 210 and 212 depending on whether the PHMJJs 208 store a binary logic-1 state or a binary logic-0 state. Thus, by storing the binary logic-1 state, the PHMJJ 208 associated with the memory cell $C_{X\_1}$ can provide a superconducting phase that is added to the sense current $I_{S\_X}$ through the Josephson junctions 210 and 212, similar to as demonstrated in the example of FIG. 3. However, by storing the binary logic-0 state, the PHMJJ 208 associated with the memory cell $C_{1\_1}$ can provide a zero superconducting phase, such that the sense current $I_{S\_1}$ through the Josephson junctions 210 and 212 is based on a portion of the added magnitudes of the word-read current $I_{WR}$ and the bit-read current $I_{BR\_1}$, similar to as demonstrated in the example of FIG. 2.

Based on the respective magnitudes of the sense currents $I_{S\_X}$ and $I_{S\_1}$ in response to the respective superconducting phases of the PHMJJs 208 relative to the critical currents of the Josephson junctions 210 and 212 of the memory cells $C_{X\_1}$ and $C_{1\_1}$, the Josephson junctions 210 and 212 of the memory cell $C_{X\_1}$ trigger and the Josephson junctions 210 and 212 of the memory cell $C_{1\_1}$ do not trigger. During the data read operation, a sense register (not shown), such as the sense register 26 in the example of FIG. 4, can monitor a voltage $V_X$ associated with the bit-read line $BLR_X$ and a voltage $V_1$ associated with the bit-read line $BLR_1$. For example, the sense register can compare the voltages $V_X$ and $V_1$ with a threshold, such as to perform differential voltage sensing.

The Josephson junctions 210 and 212, upon triggering, can provide a voltage pulse, such that the voltage $V_X$ can have a magnitude that is greater than the voltage $V_1$. Accordingly, in the example of FIG. 5, the greater magnitude of the voltage $V_X$ and the lesser magnitude of the voltage $V_1$, such as relative to a threshold magnitude, can indicate that the memory cell $C_{X\_1}$ stores a binary logic-1 state and the memory cell $C_{1\_1}$ stores a binary logic-0 state. As another example, based on the superconductivity of the bit-read line BLR, the associated sense register can be configured to measure a magnitude of the bit-read currents $I_{BR\_X}$ and $I_{BR\_1}$ to determine the digital state of the respective memory cells $C_{X\_1}$ and $C_{1\_1}$. It is to be understood that, while the example of FIG. 5 focuses on the $X^{th}$ and $1^{st}$ columns 206, bit-read currents can be provided for all of the columns 206 therebetween, such that associated voltages on the respective bit-read lines 216 can be monitored in a similar manner. Accordingly, the entire data word associated with the $1^{st}$ row 204 can be concurrently read during the data read operation. In this manner, the memory cells 202 in any of the rows 204 can be read during the data read operation, as described in the example of FIG. 5.

In view of the foregoing structural and functional features described above, a methodology in accordance with various aspects of the present invention will be better appreciated with reference to FIG. 6. While, for purposes of simplicity of explanation, the methodology of FIG. 6 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 6 illustrates an example of a method 250 for reading a memory cell in a JMRAM system (e.g., the JMRAM system 150). At 252, a word-read current (e.g., the word-read current $I_{WR}$) is generated on a word-read line (e.g., the word-read line WLR) to select a respective one of a plurality of rows (e.g., the rows 154) of an array of memory cells (e.g., the memory cells 152), each of the memory cells comprising a PHMJJ (e.g., the PHMJJ 52) that is configured to store a digital state corresponding to one of a binary logic-1 state and a binary logic-0 state. At 254, a bit-read current (e.g., the bit-read current $I_{BR}$) is generated on a bit-read line (e.g., the bit-read line BLR) associated with each of a plurality of columns (e.g., the columns 156) of the array of memory cells. At 256, the digital state is read from each of the memory cells in the respective one of the plurality of rows based on whether at least one Josephson junction (e.g., the Josephson junctions 54 and 56) in the respective memory cells triggers in response to the word-read current and the bit-read current associated with each of the plurality of columns of the array of memory cells based on a superconducting phase (e.g., the current $I_π$) provided by the PHMJJ corresponding to the stored digital state.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A memory cell comprising:
    a phase hysteretic magnetic Josephson junction (PHMJJ) that is configured to store one of a first binary logic state corresponding to a binary logic-1 state and a second binary logic state corresponding to a binary logic-0 state in response to a write current and to generate a superconducting phase based on the stored digital state; and
    at least one Josephson junction having a critical current that is based on the superconducting phase of the PHMJJ and being configured to provide an output corresponding to the stored digital state in response to a read current.

2. The memory cell of claim 1, wherein the PHMJJ is configured to generate the superconducting phase in response to storing one of the first and second binary logic states, wherein the read current combines with the superconducting phase of the PHMJJ to trigger the at least one Josephson junction to provide a voltage having a first magnitude at an output of the memory cell, the first magnitude of the voltage being indicative of the one of the first and second binary logic states.

3. The memory cell of claim 2, wherein the PHMJJ is configured to generate a zero superconducting phase in response to storing the other of the first and second binary logic states, wherein the combined read current and superconducting phase of the PHMJJ do not trigger the at least one Josephson junction, such that a voltage having a second magnitude is provided at the output, the second magnitude of the voltage being indicative of the other of the first and second binary logic states.

4. The memory cell of claim 2, wherein the at least one Josephson junction is arranged as a pair of Josephson junctions, wherein in response to the PHMJJ storing the one of the first and second binary logic states, the read current triggers the pair of Josephson junctions in an oscillatory manner to maintain the voltage having the first magnitude while the read current is provided.

5. The memory cell of claim 1, further comprising at least one transformer configured to inductively couple the read current from a primary winding to a secondary winding of the at least one transformer to provide the read current to the PHMJJ and to the at least one Josephson junction.

6. The memory cell of claim 5, wherein the at least one Josephson junction is arranged as a pair of Josephson junctions in parallel with a secondary winding of the at least one transformer and in parallel with the PHMJJ, wherein the read current is a first read current, wherein a second read current is provided to the memory cell between the secondary winding of the at least one transformer, the second read current combining with the first read current induced via the at least one transformer and with the superconducting phase to trigger the pair of Josephson junctions in response to the PHMJJ storing one of the first and second binary logic states and to not trigger the pair of Josephson junctions in response to the PHMJJ storing the other of the first and second binary logic states.

7. A Josephson magnetic random access memory (JMRAM) system comprising an array of memory cells comprising the memory cell of claim 1, the array of memory cells being arranged in rows and columns, wherein the write current is a word-write current that is provided on a word-write line associated with a row of the array of memory cells, wherein a second write current is provided on a bit-write line of the array of memory cells as a bit-write current, wherein the read current is a word-read current that is provided on a word-read line associated with the row of the array of memory cells, and wherein a second read current is provided on a bit-read line as a bit-read current.

8. The JMRAM of claim 7, wherein the word-write line and the word-read line are common to each of the memory cells in a given row of the array, and wherein the bit-write line and the bit-read line are common to each of the memory cells in a given column of the array, such that the array of memory cells are arranged in series with respect to each of the rows and each of the columns of the array.

9. The JMRAM of claim 7, wherein each of the word-write line and the bit-write line associated with a given memory cell are magnetically coupled to the PHMJJ, wherein the word-write current is provided on the word-write line through each of the memory cells in a given one of the rows during a data write operation, and wherein the bit-write line comprises a plurality of bit-write lines that are each associated with a respective one of the columns, each of a respective plurality of bit-write currents having a current direction that corresponds to storage of one of the binary logic-1 state and the binary logic-0 state in each of the memory cells in the given one of the rows.

10. The JMRAM of claim 7, wherein the bit-read line comprises a plurality of bit-read lines that are each associated with a respective one of the columns, each of a respective plurality of bit-read currents being provided to the at least one Josephson junction associated with each of the respective memory cells in a given one of the rows that is selected in response to the word-read current being provided during a data read operation to provide an indication of the stored digital state of each of the PHMJJs in the given one of the rows on the plurality of bit-read lines.

11. A method for reading a memory cell in a Josephson magnetic random access memory (JMRAM) system, the method comprising:
generating a word-read current on a word-read line to select a respective one of a plurality of rows of an array of memory cells, each of the memory cells comprising a phase hysteretic magnetic Josephson junction (PHMJJ) that is configured to store a digital state corresponding to one of a binary logic-1 state and a binary logic-0 state;
generating a bit-read current on a bit-read line associated with each of a plurality of columns of the array of memory cells; and
reading the digital state from each of the memory cells in the respective one of the plurality of rows based on whether at least one Josephson junction in the respective memory cells triggers in response to the word-read current and the bit-read current associated with each of the plurality of columns of the array of memory cells based on a superconducting phase provided by the PHMJJ corresponding to the stored digital state.

12. The method of claim 11, wherein reading the digital state comprises measuring one of a voltage and a current of the bit-read line associated with each of the plurality of columns of an array of memory cells, a magnitude of the one of the voltage and the current being indicative of whether the at least one Josephson junction of the memory cells in the respective one of the plurality of rows triggered in response to the word-read current and the bit-read current associated with each of the plurality of columns of the array of memory cells.

13. The method of claim 11, wherein generating the word-read current comprises providing the word-read current on the word-read line in each of the memory cells in the respective one of the plurality of rows in series, and wherein generating the bit-read current comprises providing the bit-read current on the bit-read line through each of the memory cells in each of the memory cells in each of the plurality of columns in series.

14. The method of claim 11, wherein reading the state from each of the memory cells comprises:
triggering the at least one Josephson junction in response to the PHMJJ providing a superconducting phase that is added to the bit-read current and the word-read current based on the PHMJJ storing one of the binary logic-1 state and the binary logic-0 state; and
not triggering the at least one Josephson junction in response to the PHMJJ not providing the superconducting phase based on the PHMJJ storing the other of the binary logic-1 state and the binary logic-0 state.

15. The method of claim 11, further comprising:
providing the word-read current associated with each of the memory cells in the respective one of the plurality of rows via a first transformer and a second transformer that are configured to inductively provide the word-read current to the at least one Josephson junction;
generating a sense current that is a sum of the word-read current, the bit-read current, and the superconducting phase that is based on the digital state stored in the PHMJJ; and
triggering a pair of Josephson junctions in an oscillatory manner upon the sense current exceeding a critical current associated with the pair of Josephson junctions.

16. A Josephson magnetic random access memory (JMRAM) array comprising:
a plurality of word-write lines each configured to conduct a respective word-write current that selects a given row of memory cells during a data write operation, the memory cells each comprising a phase hysteretic magnetic Josephson junction (PHMJJ) and at least one Josephson junction;
a plurality of bit-write lines each configured to conduct a respective bit-write current to write a digital state corresponding to one of a binary logic-0 state and a binary logic-1 state into the PHMJJ associated with each memory cell of the given row of memory cells, the PHMJJ being magnetically coupled to a respective one of the plurality of word-write lines and a respective one of the plurality of bit-write lines;
a plurality of word-read lines each configured to conduct a respective word-read current that selects a given row of memory cells during a data read operation; and
a plurality of bit-read lines each configured to conduct a respective bit-read current through each of the memory cells in a given column, the at least one Josephson junction providing an indication of the stored digital state during the data read operation in response to the word-read current, the bit-read current, and a superconducting phase provided by the PHMJJ corresponding to the stored digital state.

17. The JMRAM array of claim 16, wherein the respective bit-read and the word-read currents are configured to trigger the at least one Josephson junction to provide an output voltage based on the PHMJJ storing the binary logic-1 state.

18. The JMRAM array of claim 16, wherein the PHMJJ in a selected memory cell is configured to generate the superconducting phase in response to storing one of the first and second binary logic states, wherein the word-read current and the bit-read current of a given one of the memory cells combine with the superconducting phase of the PHMJJ to trigger the at least one Josephson junction of the selected memory cell to provide a voltage having a first magnitude on an associated bit-read line on which the bit-read current is provided, the first magnitude of the voltage being indicative of the one of the first and second binary logic states.

19. The JMRAM array of claim 18, wherein the PHMJJ in the selected memory cell is configured to not generate the superconducting phase in response to storing the other of the first and second binary logic states, wherein the combined word-read current and bit-read current of the given one of the memory cells do not trigger the at least one Josephson junction of the selected memory cell, such that a voltage having a second magnitude is provided on the associated bit-read line on which the bit-read current is provided, the second magnitude of the voltage being indicative of the other of the first and second binary logic states.

20. The JMRAM array of claim 18, wherein the at least one Josephson junction is arranged as a pair of Josephson junctions, wherein in response to the PHMJJ storing the one of the first and second binary logic states, the bit-read current and the word-read current trigger the pair of Josephson junctions in an oscillatory manner to maintain the voltage having the first magnitude while the word-read current and the bit-read current are provided.

* * * * *